United States Patent [19]
Lustig

[11] Patent Number: 5,705,414
[45] Date of Patent: Jan. 6, 1998

[54] METHOD FOR PRODUCING A GATE ELECTRODE FOR AN MOS STRUCTURE

[75] Inventor: Bernhard Lustig, München, Germany

[73] Assignee: Siemens Aktiengesellschaft, Munich, Germany

[21] Appl. No.: 779,944

[22] Filed: Dec. 23, 1996

[30] Foreign Application Priority Data

Dec. 21, 1995 [DE] Germany .................. 195 48 056.2

[51] Int. Cl.$^6$ ........................................ H01L 21/265
[52] U.S. Cl. ........................ 437/41 GS; 437/40 GS; 437/40 SW; 437/41 SW; 437/228 SW
[58] Field of Search ................ 437/40 GS, 41 GS, 437/40 SW, 41 SW, 228 SW, 947, 981

[56] References Cited

U.S. PATENT DOCUMENTS 4,358,340  11/1982  Fu .
5,202,272   4/1993  Hsieh et al. .................. 437/40 GS

FOREIGN PATENT DOCUMENTS 0084471  11/1990  Japan .................. 437/40 GS

OTHER PUBLICATIONS

"Method for Making Submicron Dimensions in Structures Using Sidewall Image Transfer Techniques", Johnson et al., IBM Technical Disclosure Bulletin, vol. 26, No. 9, Feb. 1984, pp. 4587–4589.

*Primary Examiner*—Trung Dang
*Attorney, Agent, or Firm*—Herbert L. Lerner; Laurence A. Greenberg

[57] ABSTRACT

A gate electrode for an MOS structure, such as a short-channel MOS transistor, is produced. First, a hard mask is created, using a spacer of the material of the gate electrode as the etching mask, and the hard mask is used to structure the gate electrode. The method is suitable particularly for the production of gate electrodes with very thin gate dielectrics with channel lengths below 100 nm.

3 Claims, 3 Drawing Sheets

METHOD FOR PRODUCING A GATE ELECTRODE FOR AN MOS STRUCTURE

BACKGROUND OF THE INVENTION

1. Field of the Invention

The invention pertains to MOS structures, and particularly to a method for producing a gate electrode for an MOS structure.

MOS structures with a short-channel length, especially short-channel MOSFETs, are needed for high-speed circuits. Short-channel MOSFETs have a short gate length. At low operating voltages, short gate delay times are achieved with short-channel MOS transistors.

Gate electrodes are typically formed by structuring a conductive layer with the aid of a photolithographically produced mask. Gate electrodes with dimensions below 100 nm, of the kind needed for short-channel MOS transistors, are too small to structure by optical lithography. For those structural sizes, it is currently necessary to use electron beam lithography, for instance.

A gate electrode for an MOS structure on a silicon substrate may be produced, according to U.S. Pat. No. 4,358,340 to Fu, by first forming a step structure of $SiO_2$. The surface of the silicon substrate is completely covered with $SiO_2$. On one edge of the stepped structure, a spacer is formed by conformal deposition of a polysilicon layer and anisotropic etching of the polysilicon layer. Finally, the spacer is used as an etching mask, in order to remove the stepped structure outside the spacer. The spacer is doped and used as a gate electrode. The size of the gate electrode depends on the width of the spacer at the base of the step and is independent of the minimum-feasible structural size for the specific lithographic process used. In that process, there is the danger of etching through the gate oxide, particularly if the gate oxide thickness is only a few nanometers, which is required for sub-100-nanometer short-channel transistors.

Another method for producing gate oxides with structural sizes below the limit of resolution of the lithography process used is known from C. Johnson et al., IBM Technical Disclosure Bulletin, Vol. 26, No. 9, 1984, pages 4587–4589. On a substrate that is provided with a gate oxide, a polysilicon layer and a silicon dioxide layer, a structure that has a substantially vertical edge is created from photoresist. At the edge, by conformal deposition an ensuing anisotropic etching of a layer of $Si_3N_4$ or $SiO_2$, a spacer is created. The spacer is used as an etching mask to form the gate electrode by structuring the polysilicon layer. To prevent the photoresist structure from flowing during the formation of the spacer, the photoresist is hardened by UV irradiation. After the gate electrode is structured, the spacer is removed.

SUMMARY OF THE INVENTION

It is accordingly an object of the invention to provide an alternative and improved method of producing a gate electrode for an MOS structure, which overcomes the disadvantages of the heretofore-known devices and methods of this general type and which allows dependable formation of gate electrodes of structural sizes smaller than the limit of resolution of the lithography process.

With the foregoing and other objects in view there is provided, in accordance with the invention, a method for producing a gate electrode for an MOS structure, which comprises:

forming an electrode layer of a given material on a gate dielectric formed on a semiconductor substrate;

applying an auxiliary layer on the electrode layer;

creating a step in the auxiliary layer such that a surface of the electrode layer remains covered by a resultant step-structured auxiliary layer;

forming a spacer on the step from the given material;

anisotropically etching the step-structured auxiliary layer and forming a hard mask, using the spacer as an etching mask;

anisotropically etching the electrode layer and forming a gate electrode, using the hard mask as an etching mask; and the auxiliary layer, the spacer, the gate dielectric, and the electrode layer are made with only two layer materials.

In accordance with a further feature of the invention, the step of forming the spacer comprises depositing a layer with conformal edge coverage and subsequently anisotropically etching.

In accordance with a concomitant feature of the invention, the auxiliary layer and the gate dielectric are formed of $SiO_2$, and the electrode layer and the spacer are formed of polysilicon.

In other words, the gate electrode is formed by structuring an electrode layer. The lateral extent of the gate electrode is determined by a spacer, which is formed of the same material as the gate electrode. Using the spacer as an etching mask, a hard mask is formed that is used to structure the gate electrode. In the structuring of the gate electrode, the spacer, which is made of the same material, is simultaneously removed as well. A separate step for removing the spacer is thus dispensed with. Nevertheless, the gate electrode is formed with substantially vertical edges.

No resist mask is necessary in the novel process, and accordingly, etching through extremely thin gate dielectrics in the course of gate structuring is averted.

The spacer is formed on one edge of a step, preferably by deposition of a layer with conformal edge coverage and ensuing anisotropic etching of the layer. The step is created in an auxiliary layer that covers the surface of the electrode layer.

The auxiliary layer is created continuously of one and the same material. The height of the step is adjusted by way of the etching time in the formation of the step. The advantage is found in the fact that only one etching process is necessary to form the hard mask. Preferably, the auxiliary layer is formed of TEOS $SiO_2$ and the electrode layer and the spacer are formed of polysilicon. These materials can be etched with good selectivity relative to one another in standard processes.

Other features which are considered as characteristic for the invention are set forth in the appended claims.

Although the invention is illustrated and described herein as embodied in a method for producing a gate electrode for a MOS structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
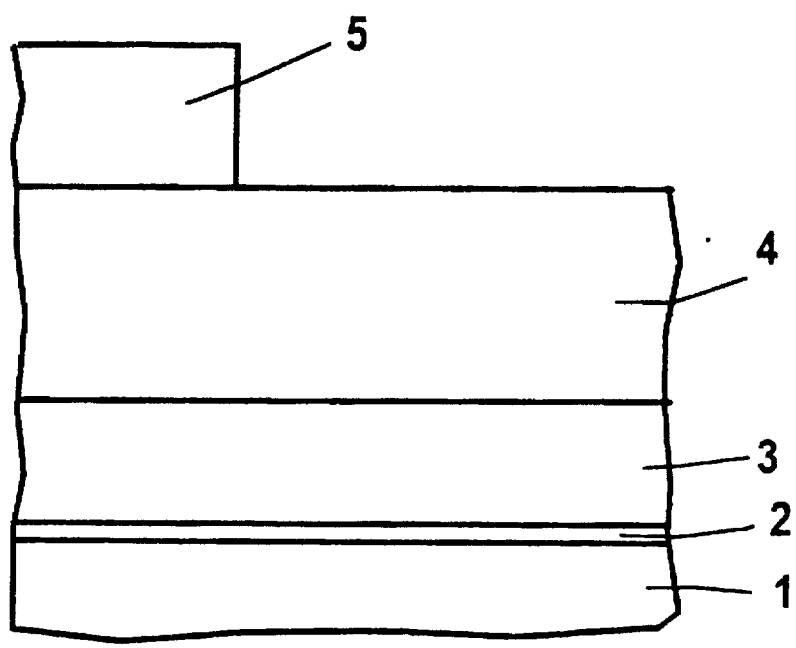
FIG. 1 is a partial, diagrammatic elevational view of a stratified system of a semiconductor substrate with a gate dielectric, an electrode layer, an auxiliary layer, and a photoresist mask.

Referring now to the figures of the drawing in detail and first, particularly, to FIG. 1 thereof, there is seen a substrate 1, for instance a monocrystalline silicon wafer or an SOI substrate, onto which a gate dielectric 2 is applied. By way of example, the gate dielectric 2 is formed by thermal oxidation from $SiO_2$, with a layer thickness of 3 to 4 nm, for example (see FIG. 1).

On the gate dielectric 2, an electrode layer 3 is applied. The electrode layer 3 for instance comprises doped polysilicon and has a thickness of 100 nm, for instance. The electrode layer 3 is for instance doped with a dopant concentration in the range of $10^{21}$ cm$^{-3}$.

An auxiliary layer 4 is applied on the electrode layer 3, in a layer thickness of 200 nm, for instance. By way of example, the electrode layer 4 is formed in a TEOS process from $SiO_2$.

A photoresist mask 5 is produced over the surface of the auxiliary layer 4 which defines the location of an edge of a gate electrode to be produced later.

Figure 2:
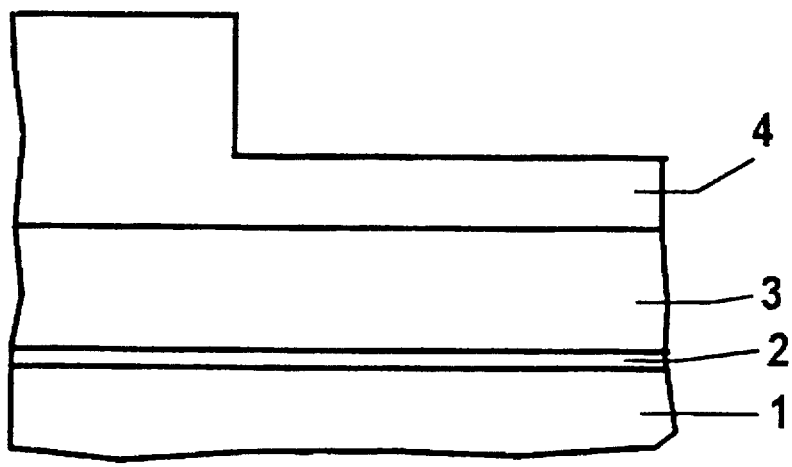
FIG. 2 is a similar view thereof after the formation of a step in the auxiliary layer.

By anisotropic etching, for instance using $CHF_3$ RIE (reactive ion etching), a step with a substantially vertical edge (see FIG. 2) is then created in the auxiliary layer 4. The step has a height of 150 nm, for instance. The surface of the electrode layer 3 therefore remains covered by the steplike-structured auxiliary layer 4.

The height of the step is controlled by way of the etching time. Afterward, the photoresist mask 5 is removed.

Figure 3:
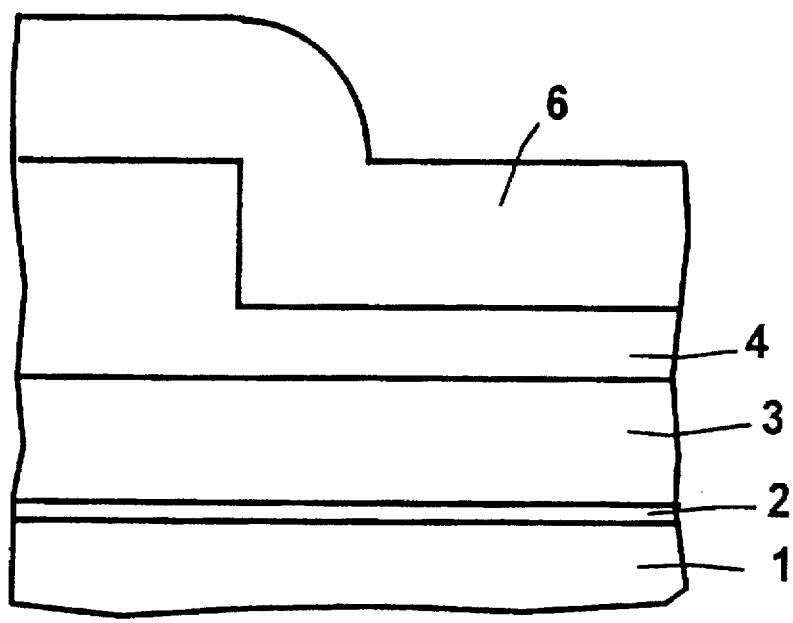
FIG. 3 is a similar view thereof after the deposition of a layer with conformal edge coverage.

A layer 6 with substantially conformal edge coverage (see FIG. 3) is deposited over the entire surface. The layer 6 is deposited from polysilicon, for instance, in a layer thickness of 100 nm, for instance.

Figure 4:
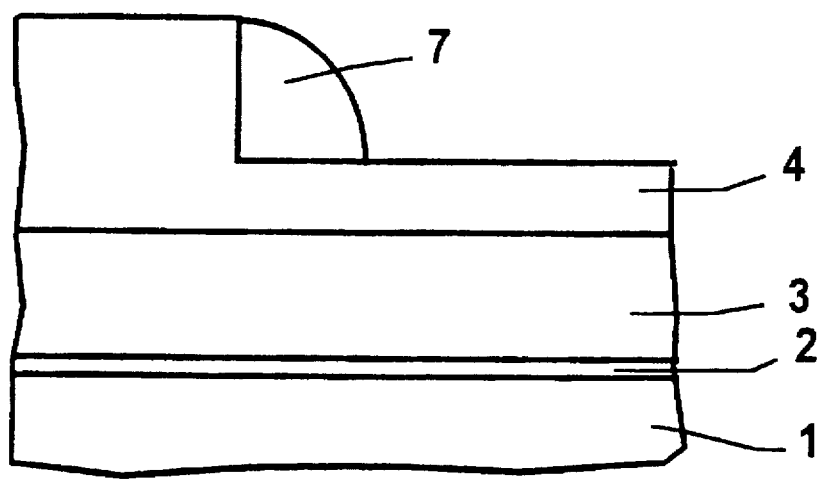
FIG. 4 is a similar view thereof after the formation of a spacer.
Figure 5:
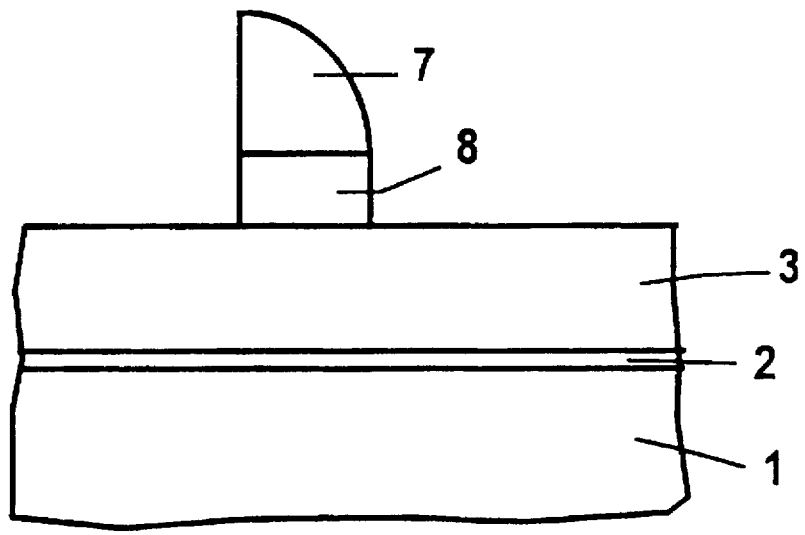
FIG. 5 is a similar view thereof after the formation of a hard mask.

Horizontal portions of the layer 6 are removed by anisotropic etching, for instance using HBr RIE. A spacer 7 (FIG. 4) remains at the edge of the steplike-structured auxiliary layer 4. In plan view, the spacer 7 formed a closed curve. If that shape is undesired for the gate electrode, then the spacer 7 can be structured by non-illustrated wet-chemical processes using a resist mask. The curvature of the spacer 7 may be limited to its upper portion, by making the edge of the steplike-structured auxiliary layer higher.

Using the spacer 7 as an etching mask, the auxiliary layer 4 is then structured. This creates a hard mask 8 from the auxiliary layer 4. If the auxiliary layer 4 is continuously of deposited $SiO_2$(TEOS), for example, then its structuring is done for example by an anisotropic $CHF_3$ and $CF_4$ etching process. This process has good selectivity with respect to polysilicon, so that the surface of the electrode layer 3 initially laid bare in the etching of the auxiliary layer 4 on one side of the spacer 7 is attacked only slightly by etchant.

Figure 6:
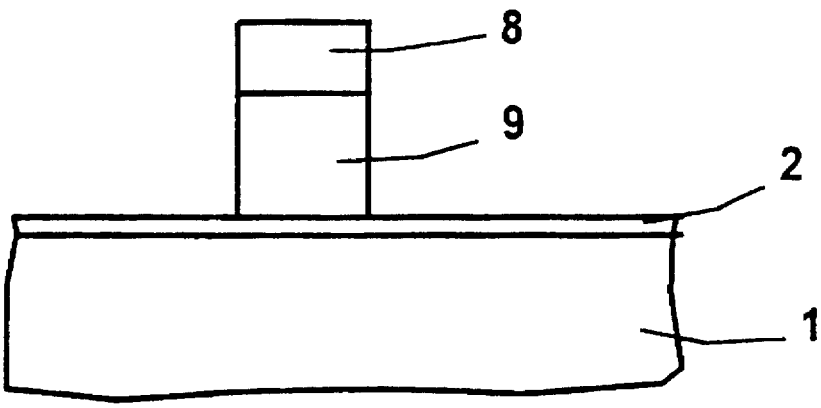
FIG. 6 is a similar view of the system after the formation of a gate electrode by structuring of the electrode layer.

Finally, the electrode layer 3 is structured by anisotropic etching, using HBr, for instance. This creates a gate electrode 9. Simultaneously in this etching process, the spacer 7, which is of the same material as the gate electrode 9, is removed (see FIG. 6).

I claim:

1. A method for producing a gate electrode for an MOS structure, which comprises:

forming an electrode layer of a given material on a gate dielectric formed on a semiconductor substrate;

applying an auxiliary layer on the electrode layer;

creating a step in the auxiliary layer such that a surface of the electrode layer remains covered by a step-structured auxiliary layer;

forming a spacer on the step from the given material;

anisotropically etching the step-structured auxiliary layer and forming a hard mask, using the spacer as an etching mask;

anisotropically etching the electrode layer and forming a gate electrode, using the hard mask as an etching mask; and wherein the steps of forming the auxiliary layer, the spacer, the gate dielectric, and the electrode layer are performed using only two layer materials.

2. The method according to claim 1, wherein the step of forming the spacer comprises depositing a layer with conformal edge coverage and subsequently anisotropically etching.

3. The method according to claim 1, which comprises forming the auxiliary layer and the gate dielectric of $SiO_2$, and wherein the given material of the electrode layer and the spacer is polysilicon.

* * * * *